US010454496B1

(12) United States Patent
Prieditis (10) Patent No.: US 10,454,496 B1
(45) Date of Patent: Oct. 22, 2019

(54) METHOD AND SYSTEM FOR FACILITATING COMPRESSION

(71) Applicant: Armand Prieditis, Arcata, CA (US)

(72) Inventor: Armand Prieditis, Arcata, CA (US)

( * ) Notice: Subject to any disclaimer, the term of this patent is extended or adjusted under 35 U.S.C. 154(b) by 0 days.

(21) Appl. No.: 16/204,063

(22) Filed: Nov. 29, 2018

(51) Int. Cl.
| | |
|---|---|
| *H03M 7/30* | (2006.01) |
| *G06F 17/16* | (2006.01) |
| *G06F 17/18* | (2006.01) |
| *G06N 20/00* | (2019.01) |
| *G06N 7/00* | (2006.01) |

(52) U.S. Cl.
CPC .......... *H03M 7/3082* (2013.01); *G06F 17/16* (2013.01); *G06F 17/18* (2013.01); *G06N 7/00* (2013.01); *G06N 20/00* (2019.01)

(58) Field of Classification Search
CPC ....... H03M 7/3082; G06N 7/00; G06N 20/00; G06F 17/16; G06F 17/18

USPC ................. 341/50–51, 87; 382/232
See application file for complete search history.

(56) References Cited

U.S. PATENT DOCUMENTS 7,158,679 B2 * 1/2007 Sano ........................ G06T 9/007
 382/166
9,693,072 B2 * 6/2017 Inada .................... H04N 19/174

* cited by examiner

*Primary Examiner* — Khai M Nguyen (57) ABSTRACT

During operation, embodiments of the subject matter can perform compression of an n-dimensional m-channel patch based on unsupervised learning (clustering). Embodiments of the subject matter can perform multiple such compressions of patches tessellated (tiled) across a space. Embodiments of the subject matter can also perform hierarchical compression through recursive application of embodiments of the subject matter. Embodiments of the subject matter can compress but are not limited to compressing the following: a database, a sequence, an image, a video, and a volumetric video.

15 Claims, 3 Drawing Sheets

FIG. 1

N-DIMENSIONAL M-CHANNEL PATCHES TILED ACROSS SURFACE
200

| 8 | $X_{0,8}$ | $X_{1,8}$ | $X_{2,8}$ | $X_{3,8}$ | $X_{4,8}$ | $X_{5,8}$ | $X_{6,8}$ | $X_{7,8}$ | $X_{8,8}$ |
|---|---|---|---|---|---|---|---|---|---|
| 7 | $X_{0,7}$ | $X_{1,7}$ | $X_{2,7}$ | $X_{3,7}$ | $X_{4,7}$ | $X_{5,7}$ | $X_{6,7}$ | $X_{7,7}$ | $X_{8,7}$ |
| 6 | $X_{0,6}$ | $X_{1,6}$ | $X_{2,6}$ | $X_{3,6}$ | $X_{4,6}$ | $X_{5,6}$ | $X_{6,6}$ | $X_{7,6}$ | $X_{8,6}$ |
| 5 | $X_{0,5}$ | $X_{1,5}$ | $X_{2,5}$ | $X_{3,5}$ | $X_{4,5}$ | $X_{5,5}$ | $X_{6,5}$ | $X_{7,5}$ | $X_{8,5}$ |
| 4 | $X_{0,4}$ | $X_{1,4}$ | $X_{2,4}$ | $X_{3,4}$ | $X_{4,4}$ | $X_{5,4}$ | $X_{6,4}$ | $X_{7,4}$ | $X_{8,4}$ |
| 3 | $X_{0,3}$ | $X_{1,3}$ | $X_{2,3}$ | $X_{3,3}$ | $X_{4,3}$ | $X_{5,3}$ | $X_{6,3}$ | $X_{7,3}$ | $X_{8,3}$ |
| 2 | $X_{0,2}$ | $X_{1,2}$ | $X_{2,2}$ | $X_{3,2}$ | $X_{4,2}$ | $X_{5,2}$ | $X_{6,2}$ | $X_{7,2}$ | $X_{8,2}$ |
| 1 | $X_{0,1}$ | $X_{1,1}$ | $X_{2,1}$ | $X_{3,1}$ | $X_{4,1}$ | $X_{5,1}$ | $X_{6,1}$ | $X_{7,1}$ | $X_{8,1}$ |
| 0 | $X_{0,0}$ | $X_{1,0}$ | $X_{2,0}$ | $X_{3,0}$ | $X_{4,0}$ | $X_{5,0}$ | $X_{6,0}$ | $X_{7,0}$ | $X_{8,0}$ |
|   | 0 | 1 | 2 | 3 | 4 | 5 | 6 | 7 | 8 |

↓

N-DIMENSIONAL K-CHANNEL PATCHES
210

↓

| | | | |
|---|---|---|---|
| 2 (6-8) | $X'_{0,2}$ | $X'_{1,2}$ | $X'_{2,2}$ |
| 1 (3-5) | $X'_{0,1}$ | $X'_{1,1}$ | $X'_{2,1}$ |
| 0 (0-2) | $X'_{0,0}$ | $X'_{1,0}$ | $X'_{2,0}$ |
|   | 0 (0-2) | 1 (3-5) | 2 (6-8) |

METHOD AND SYSTEM FOR FACILITATING COMPRESSION

BACKGROUND

Field

The subject matter relates to data compression, where the data can be a database, a table, a sequence, an image, a video, or any multi-dimensional shape comprised of elements that are vectors (channels). For example, each pixel element in an image can comprise a three-element vector, which can correspond to the RGB channels.

Related Art

Internet video streaming and downloads have exploded the last few years. This growth is not likely to stop: video traffic is expected to quadruple in the next five years. In addition, the Big Data revolution resulted in enormous and diverse data sets including but not limited to images, texts, audio, genomic data, 3D virtual reality data, medical volumetric video data, and point cloud data from autonomous mapping. This growth is driving further refinements in compression to ensure Quality of Experience (QoE) on the client (receiver) side.

QoE comprises three parts: speed of compressed content delivery from the server to the receiver, speed of decompression on the receiver side, and fidelity of the decompressed content on the receiver side. QoE heavily impacts revenue on the server side: when bandwidth becomes narrower and content becomes large, QoE becomes worse, which can prompt a client to cancel a service, seek the content from sources with more bandwidth, or simply give up in frustration.

The market for QoE is enormous because most manufacturers have allocated personnel, time, funds, and even space on integrated circuits and chips for video and audio compression. This means anything that improves QoE will be adopted quickly. Moreover, since bandwidth costs users and carriers money, any mechanism that can produce the same QoE with lower bandwidth can facilitate a gain in market share. Slow downloads can also eat up energy (e.g., battery power), which can raise overall costs. Compression might help improve QoE through faster downloads of compressed data, faster decompression on the client side, and higher fidelity decompressed content.

Existing compression methods tend to leverage redundant information. For example, images of nature scenes tend to contain a large amount of redundant information because neighbor pixels tend to be correlated with each other. Most existing compression methods take advantage of such correlation to reduce image size for compression.

For example, traditional compression methods such as JPEG rely on hand-crafted though general-purpose encoder and decoder pairs (called codecs). But these codecs do not leverage particulars of the data being compressed.

In contrast adaptive machine learning methods such as neural networks, can leverage the particulars of the data and have been shown to produce better quality images with 25% smaller file sizes. But such methods still result in images that are too big to load quickly on mobile devices.

Hence, what is needed is a method and a system for compression that facilitates high QoE (i.e., fast downloads with fast and high fidelity decompression), that does not require hand-crafting (i.e., scales across multi-dimensional data of various sizes), and that can leverage the particulars of the data being compressed while adapting to the bandwidth at hand.

SUMMARY

One embodiment of the subject matter can compress data based on unsupervised learning (clustering) and then provide that compressed data to a receiver, which can then decompress it.

This embodiment facilitates a client to produce, for example, high-definition video from low-bandwidth transmission, thus improving QoE. The results of clustering (i.e., the parameters) can be pre-computed across multiple samples of the data. For example, the results of clustering can be pre-computed across a sample of images available on the internet. Once pre-computed, the compression model (the results of clustering) can be provided to anyone or any system to compress similar data. The clustering can also run in real-time by embodiments of the subject matter.

Embodiments of the subject matter could result in faster and more accurate diagnoses in medicine. For example, embodiments of the subject matter could facilitate quickly sending detailed medical images of a patient to the best doctors throughout the world for a faster and more accurate diagnosis based on high-fidelity decompressed images. Patients from under-served and remote areas could especially benefit from embodiments of the subject matter.

Embodiments of the subject matter could benefit particular types of medical imaging by customizing its compression to suit particular needs. For example, in a mammogram the boundaries between dense and not-dense tissues is important in diagnosis. Embodiments of the subject matter can take that density difference into account by producing compressions based on clustering over a training set comprising only mammogram images. The results of clustering can be pre-computed across a sample of such images for medical applications including but not limited to breast cancer diagnosis.

Embodiments of the subject matter can also be useful in emergency situations associated with disaster zones, where bandwidth might be limited but where high-quality medical images need to be transmitted to doctors outside of the disaster zone.

For secure encryption methods, embodiments of the subject matter can be used to generate one-time encryption/decryption keys based on compression. That is, the data to be encrypted can be clustered for encryption, not just compression.

Embodiments of the subject matter can be used to reduce download costs. For example, companies that spend enormous amounts of money on infrastructures for image downloads (e.g., Twitter) could see lighter loads on their infrastructure and therefore scale down spending on such infrastructures.

Embodiments of the subject matter can be used to compress natural language sequences through numerical encodings of words such as word embeddings or one-hot encodings. In addition, text can be encoded as images, or a sequence of images across multiple pages.

More generally, embodiments of the subject matter can facilitate compression of multiple patches, tessellated (tiled) across the data, where a patch comprises an n-dimensional piece of data comprising multiple channels. Multiple such patches can be compressed and downloaded such that an entire piece of data (e.g., a database, an image, or a video) can be decompressed on the receiver's side. That is, embodiments of the subject matter can be applied repeatedly over multiple patches and provided to a receiver serially or in parallel or in some combination thereof.

For example, when n=0, a patch can be a row in a database or table and the channels can represent the columns of that table. When n=1, a patch can be a sequence of such multiple channels. For example, the patch might be a portion of an audio wavefile or a portion of an audio spectrogram, where each channel can be associated with a particular frequency and its corresponding power value.

When n=2, the patch can be part of an image, where the channels represent Red, Green, and Blue (RGB) levels. Note that a patch can be square, rectangular, or any two dimensional regular or irregular shape. The aforementioned RGB channels are only illustrative of the type of information that can be associated with an image. For example, RGB levels could be translated to another color space known as YCbCr, which covers the same color space though with a different representation. It has been shown that two of the replacement components, Cb and Cr (the color components), are highly compressible because a human viewer is more able to discriminate the brightness component (Y) than color components (Cb and Cr). This means that the brightness value can be higher fidelity than the two color components. Embodiments of the subject matter can automatically facilitate this aspect of human vision by down-sampling chroma values prior to clustering.

When n=3, the data can be a video, which comprises a sequence of frames (images). For example, a patch in a video can be three-dimensional with RGB channels. More specifically, a patch in a video can be a 3×3×3 hypercube of RGB channels, where each slice of the hypercube can be associated with a frame. The first 3×3 slice can be associated with frame i−1. The second 3×3 slice can be associated with frame i. The third 3×3 slice can be associated with frame i+1. Together, these three slices comprise the 3×3×3 hypercube. Embodiments of the subject matter can leverage relationships between pixels in the three frames.

Thus, the three-dimensional space in a video comprises multiple 3×3×3 cubic patches of RGB channels tessellated across the entire video. Embodiments of the subject matter are not limited to cubes, rectangular parallelepiped, and other regular or irregular shapes (patches) that can be used to tessellate the three-dimensional space by themselves or in conjunction with other patch shapes.

When n=4, the patches can comprise three-dimensional shapes over time. For example, such patches can be from a three-dimensional video of the brain or body over time, as obtained from imaging devices such as MRI, fMRI, PET, CAT, or CT. Any one frame comprises a three-dimensional volume, where each voxel comprises RGB values.

Embodiments of the subject matter are not limited to four dimensions but can be any number of dimensions. More generally, a patch can be a cube, a rectangle, a hypercube, a hyperrectangle, a hypervolume, or any regular or irregular shape in multiple dimensions.

Embodiments of the subject matter can perform multiple such compressions, which can correspond to compressing an entire piece of data. Multiple different patches or the same shape of a patch can be used to tesselate (tile) or cover a particular space (n-dimensional volume). The compressed versions of these multiple patches of the same or different shape that tesselate a space can then be provided to the receiver in any order, serially or in parallel, thus facilitating decompression of the entire n-dimensional space. For example, in a video, the compressed versions of a patch can be provided frame by frame, in order of appearance, and left to right and top to bottom for any frame.

Particular embodiments of the subject matter described in this specification can be implemented so as to realize better QoE for the receiver: faster downloads, faster decompression, and higher fidelity decompressions.

The details of one or more embodiments of the subject matter are set forth in the accompanying drawings and the description below. Other features, aspects, and advantages of the subject matter will become apparent from the description, the drawings, and the claims.

BRIEF DESCRIPTION OF THE FIGURES

In the figures, like reference numerals refer to the same figure elements.

DETAILED DESCRIPTION

Figure 1:
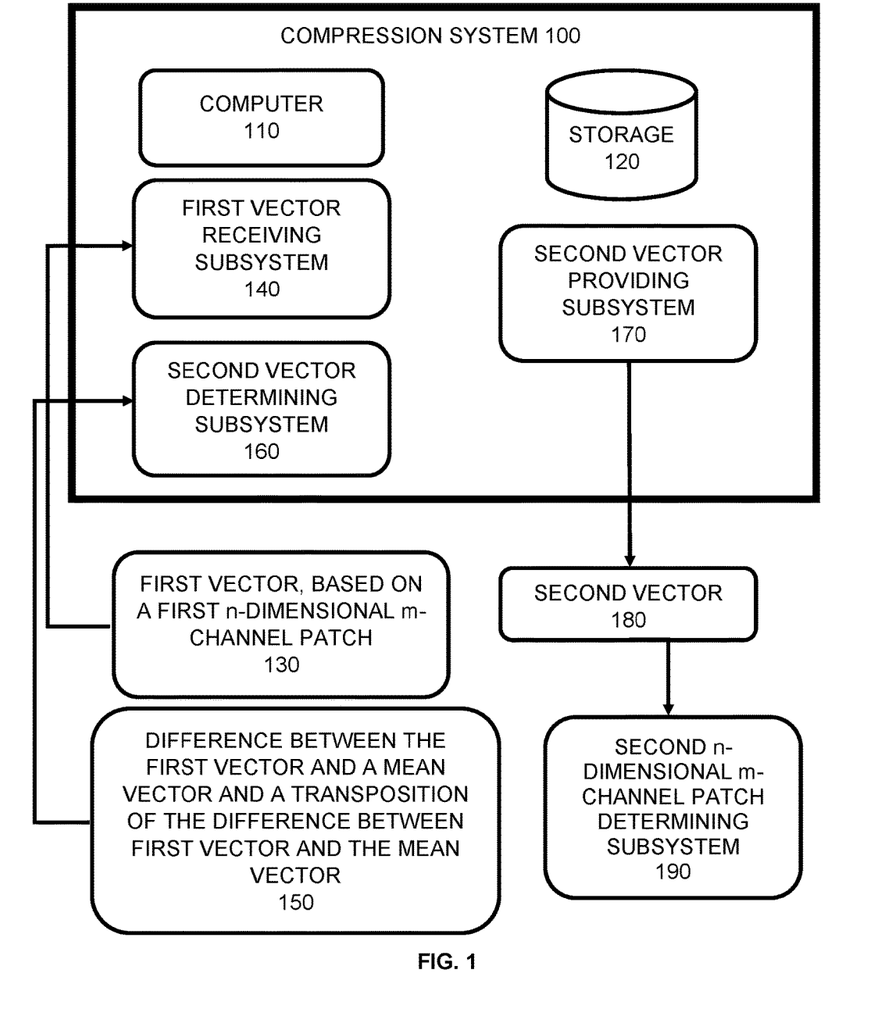
FIG. 1 shows an example compression system.

FIG. 1 shows an example compression system 100 in accordance with an embodiment of the subject matter. Compression system 100 is an example of a system implemented as a computer program on one or more computers in one or more locations (shown collectively as computer 110), with one or more storage devices in one or more locations (shown collectively as storage 120), in which the systems, components, and techniques described below can be implemented.

Compression system 100 receives first vector 130, which is based on a first n-dimensional m-channel patch. The first vector can be a flattened version of the elements of the first n-dimensional m-channel patch. Here "flattening" means that all the elements of the patch are flattened into a vector. For example, in an image, the first vector can comprise a 27-element vector, which comprises the RGB values of a flattened 3×3 patch. Similar flattening can be applied to any first n-dimensional m-channel patch. The result is a vector that contains every element's value in the first n-dimensional m-channel patch.

Compression system 100 receives first vector 130 with receiving subsystem 140. Next, compression system 100 determines a second vector with second-vector determining system 160 based on a difference between the first vector and a mean vector and a transposition of the difference between the first vector and the mean vector 150. The mean vector is based on a plurality of n-dimensional m-channel patches, each of which has been flattened as described above. The mean vector is an average of these flattened vectors. These flattened vectors can be training examples for an unsupervised learning (clustering) system, which can produce the mean vector, a covariance matrix, and a probability distribution of clusters.

The training examples for the unsupervised learning (clustering) system can comprise flattened n-dimensional m-channel patches sampled from the data. These flattened samples can be exhaustive (i.e., all possible flattened n-dimensional m-channel patches), randomly chosen, or chosen based on some pre-defined criteria, which can reflect the desired parts of the data. Multiple different samples can be used to produce multiple different first vectors, all of which can be combined on the receiver side, after decompression, through averaging or other combinational methods. Note that flattening is not essential in embodiments of the subject matter and is merely an artifact of a particular clustering method, which expects training data in a set of rows of vectors (columns), where the columns correspond to features. Clustering algorithms can be modified to expect training data in the form of one or more patches rather than rows where each row corresponds to a flattened patch. Flattening is also an artifact of the typical way to represent a mean over the clusters as a vector rather than as a patch. The mean could also be defined over a patch rather than a flattened version of a patch.

In a preferred embodiment of the subject matter, the second vector s is comprised of k≥1 elements, where the ith element of s is defined as:

$$s_i = \frac{\frac{1}{(x-\mu_i)^T \Sigma_i^{-1}(x-\mu_i)}}{2} + \frac{3}{\ln|\Sigma_i|} - \frac{4}{\ln p_i}$$

Here, x is the first vector, $\mu_i$ is a mean vector for the ith cluster, T is the transpose operator, $\Sigma_i$ is a covariance matrix for the ith cluster, $\Sigma_i^{-1}$ is an inverse of the covariance matrix for the ith cluster, $|\Sigma_i|$ is a determinant of the covariance matrix, and $p_i$ is a probability of the ith cluster. For a given number of clusters, these parameters can be computed or approximated with Expectation-Maximization, where the ith mixture is characterized by $\mu_i$, $\Sigma_i$, and $p_i$. Other methods can be used to compute these parameters. Typically, these methods are iterative and a small random value is added along the diagonal of the covariance matrix to prevent singularity. Similarly, $p_i$ can be approximated from the frequency count (how many rows are assigned to the cluster i) for any one iteration, with appropriate constants added to the numerator and denominator to avoid divide-by-zero errors.

As mentioned above, the training data for this clustering is one or more rows of flattened n-dimensional m-channel patches. For example, Expectation-Maximization can be used to determine $\mu_i$, $\Sigma_i$, and $p_i$ based on this training data. As no target labels are part of the input training data, this clustering method can be termed unsupervised learning.

Many other methods can be used to compute these quantities for each mixture as well as to choose the number of mixtures, which corresponds to length of the second vector. Moreover, $s_i$ can be represented through many different mathematically equivalent forms, with or without normalization constants. The particular form above is derived from a multivariate normal distribution with normalization constants removed and a natural logarithm transformation applied, both for ease of computation. Alternatively, a probabilistic version of the multivariate normal distribution can be used. However, this results in a more complex form, which includes exponentials.

The right-hand side of the equation can be viewed as a distance metric between a particular vector x and a particular cluster i, characterized by $\mu_i$, $\Sigma_i$, and $p_i$. Item 1 in the equation corresponds to the difference between the first vector and a mean vector and a transposition of the difference between the first vector and the mean vector. Item 2 in the equation corresponds to the Mahalanobis distance, a common distance measure. Item 3 measures the amount of uncertainty (multi-dimensional spread) in the cluster: the smaller this item is, the less uncertainty. Item 4 corresponds to the prior probability of the cluster. This item is subtracted because the larger the prior probability, the closer the natural logarithm of the prior probability, which will be negative, will be to zero.

Many other simplified forms of this equation are possible, including the following:

$$s_i = \frac{5}{(x-\mu_i)^T \Sigma_i^{-1}(x-\mu_i)}$$

$$s_i = \frac{6}{(x-\mu_i)^T(x-\mu_i)}$$

Item 5 corresponds to the Mahalanobis distance. This distance can also have a simplified form, where the covariance matrix is diagonal (i.e., off-diagonal values are 0). Item 5 is the Euclidean distance, which is used in the k-means method of clustering. K-means clustering with the distance metric in items 5 or 6 can also be leveraged to produce the parameters that are fed into compression system 100.

A preferred embodiment of compression system 100 leverages all three of $\mu_i$, $\Sigma_i$, and $p_i$ as in the equation above with items 1-4, for k≥1 clusters, to produce a k-length second vector in second vector determining system 160.

Note that the number of clusters k can be determined based on bandwidth constraints and desired QoE. Alternatively, the number of clusters k can be determined experimentally. For example, k can be determined based on a validation set or the original training set, by determining when the likelihood (or a similar measure) does not appreciably increase as k increases. This is a point of diminishing returns, where overfitting, which is not desirable, begins to show its effects.

Subsequently, compression system 100 provides second vector 180 to a receiver with second vector providing system. A receiver can then determine a second n-dimensional m-channel patch based on second vector 180 with second n-dimensional m-channel patch determining subsystem 190. The second n-dimensional m-channel patch can be called a "reconstruction" of the first n-dimensional m-channel patch, though there is no guarantee of a lossless "reconstruction."

The second n-dimensional m-channel patch determining subsystem can also leverage a previously trained model, where the previously trained model can be based on training data comprising pairs of two elements. The first element can be a second vector (as produced with Items 1-4 above) and second element can be a corresponding vector of a flattened n-dimensional m-channel patch. A supervised learning method can be used to learn a model which can predict each element of the corresponding vector given the first element. Non-parametric methods such as nearest neighbor can also be used to predict each element of a flattened n-dimensional m-channel patch.

Another way to produce the corresponding vector is to transform the second vector into a vector of probabilities and then determine a weighted sum of each cluster's probability multiplied by each cluster's corresponding mean vector. Next, the resulting vector can be converted to the n-dimensional m-channel patch by unflattening it. One method to produce a vector w from the second vectors can be based on the following equation:

$$w = \frac{\sum_{i=1}^{k} e^{-s_i} \mu_i}{\sum_{i=1}^{k} e^{-s_i}}$$

The vector w can then be translated to the second n-dimensional m-channel patch based on a mapping between each location in the vector w and its corresponding location in the second n-dimensional m-channel patch. Embodiments of the subject matter can additionally provide the receiver with the mean vector for each cluster such that a transformation to the second n-dimensional m-channel patch can be facilitated on the receiver side based on the equation for w above.

This approach, based on w, to determining a second n-dimensional m-channel patch based on second vector 180 with second n-dimensional m-channel patch determining subsystem 190 doesn't require building a model based on pairs of elements comprising second vectors and representation of the patch as a target. That is, the same model that was used in clustering can be repurposed for decompression. For example, a generative cluster model such as Gaussian Mixtures can be repurposed as a high-fidelity decompressor/decoder on the receiver side.

In contrast, neural net models, such as autoencoders, are not generative and require two stages of learning: learn an intermediate representation (i.e., the encoder) from the data and then learn how to recreate the original data (i.e., a decoder). These stages are typically combined, which can be computationally harder. The Expectation-Maximization approach to clustering attempts to find models that maximize the likelihood of the data, which directly addresses the decoding portion. That is, the parameters of a Gaussian Mixture can be used both to compress and decompress an n-dimensional m-channel patch in accordance with embodiments of the subject matter described above.

Expectation-Maximization and other clustering models can produce several different models from the same training set. Each of these different clustering models can be used to compress the data differently, with decompression on the receiver side as described above. A set of these decompressions can be combined on the receiver side, for example, by averaging their results over multiple decompressed n-dimensional m-channel patches. Combining multiple different decompressions can be important to facilitate improved decompressed fidelity, which in turn results in improved QoE for the receiver. These decompressions can be run in parallel for greater speed, as part of the QoE process.

Embodiments of the subject matter can also facilitate hierarchical compression as follows. Given a tessellation (tiling) of a space with n-dimensional m-channels patches, the space of n-dimensional m-channels patches can be sampled as described above, flattened, clustered into k clusters, and then each patch can be compressed into k channels accordance with embodiments of the subject matter.

The patch itself can be replaced by the k-channels and repositioned geographically in the context of the other patches, which have also been replaced by their corresponding k channels. For example, the center of a 3×3 two-dimensional patch of RGB channels can be replaced by a single patch (point) of k-channels, which represents the distance to each cluster from the 3×3 patch. This patch (point) can then be positioned relative to other similarly compressed patches (points) so that the geographic proximity of the original n-dimensional m-channel patch to nearby original n-dimensional m-channel patches in the space is approximately preserved.

These new n-dimensional k-channel patches can then be sampled as described above, flattened, clustered into j clusters, and further compressed also in accordance with embodiments of the subject matter. This process can repeat on the new n-dimensional j-channel patches by placing them in a geographic context that is in approximately the same relationship as the original n-dimensional k-channel patches. More generally, this process can repeat recursively multiple times, until a desired level of compression is reached.

For example, an image could be tessellated (tiled) by 3×3 patches of RGB channels. In accordance with embodiments of the subject matter, each of these 3×3 patches of RGB channels can then be converted to k-length second vectors through sampling and clustering. Next, each of these k-length second vectors replace the whole of the corresponding 3×3 patches of RGB channels from which they were derived, thus compressing the original data. This process can be repeated multiple times until a desired level of compression or fidelity is obtained.

Note that the sampling and flattening can be interchanged. That is, the patches can be flattened first into a set of rows and then the rows can be sampled. Or, as described above, the patches can first be sampled and then flattened for further processing.

Figure 2:
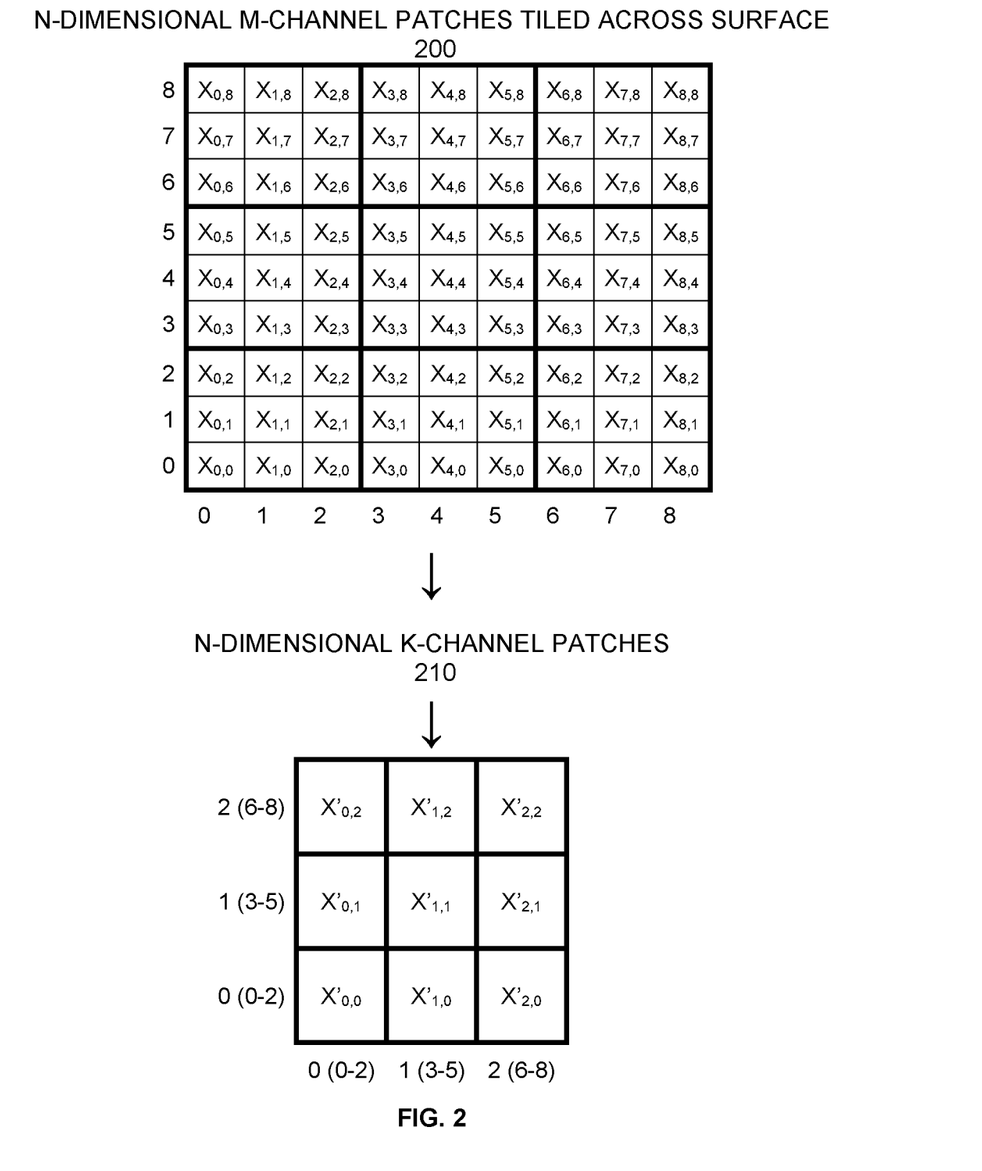
FIG. 2 shows an example of hierarchical compression.

FIG. 2 shows an example process of hierarchical compression. The figure shows two-dimensional three-channel patches tessellated (tiled) across surface 200, which comprises a 9×9 example image of RGB values. For convenience of understanding, each location is labeled based on its coordinates. For example, $X_{2,3}$ corresponds to a RGB pixel location indexed by x=2 and y=3. This particular RGB pixel location is part of a 3×3 patch with x values between 0 and 2 and y values between 3 and 5. In this example, the entire surface is tiled with 3×3 patches. An irregularly shaped patch can also be used to tesselate (tile) the surface.

Each of these nine 3×3 patches of 3 channels (RGB) can then be reduced to a single 3×3 patch of k-channels, through flattening, clustering, creation of a second vector based on a distance metric in accordance with embodiments of the subject matter. The flattened versions can then be placed into their corresponding geographic positions, as shown in n-dimensional k-channel patches 210. In the figure, each of the x' are k-length vectors, where the ith element corresponds to the distance to the ith cluster, as described above. These new n-dimensional k-channel patches can then be further compressed through recursive application of embodiments of the subject matter.

If n-dimensional m-channel patches tiled across surface 200 comprised 18×18 RGB pixels, n-dimensional k-channel patches 210 will be comprised of 6×6 k-channel patches. These 6×6 n-dimensional k-channel can then be further compressed into a 2×2 patch with j-channels, by sampling, clustering into j clusters, determining a j-length distance vector in accordance with embodiments of the subject matter, and then placing that vector into the geographic context of the patch from which it was derive so as to approximately preserve neighbor relationships in the patch from which the vector was derived.

The preceding example described a three-level compression hierarchy: 18×18 3 channels→6×6 k channels→2×2 j channels. For example, if k=4 and j=3, embodiments of the subject matter can compress 972 pieces of information to 144 pieces of information to 27 pieces of information. In general, compression can be a reduction in the amount of information, which is what this example illustrates.

The receiver can be provided the final compression and a way to decompress a second vector using a decompression method described above. Hierarchical decompression requires only decompression between levels using a compression method described above for determining the second n-dimensional m-channel patch. Similar hierarchical compression and decompression can be applied to any n-dimensional m-channel filled space including but not limited to sequences, videos, or 3D videos such as from a time-series of frames from a volumetric medical scanning device such as CAT, CT, PET, MRI, and fMRI.

Hierarchical compression can be an alternative to deep learning, which uses various pooling techniques based on simple functions such as the mean or the maximum over all RGB values, by channel. Not only do these simple functions not capture as much information as the second vector in embodiments of the subject matter, but such pooling is typically accomplished only per channel. That is, the channels are treated separately. In contrast, embodiments of the subject matter combine all channels at once as part of the compression. Embodiments of the subject matter can be translation, rotation, and scale invariant. In contrast, pooling is typically only translation invariant.

Figure 3:
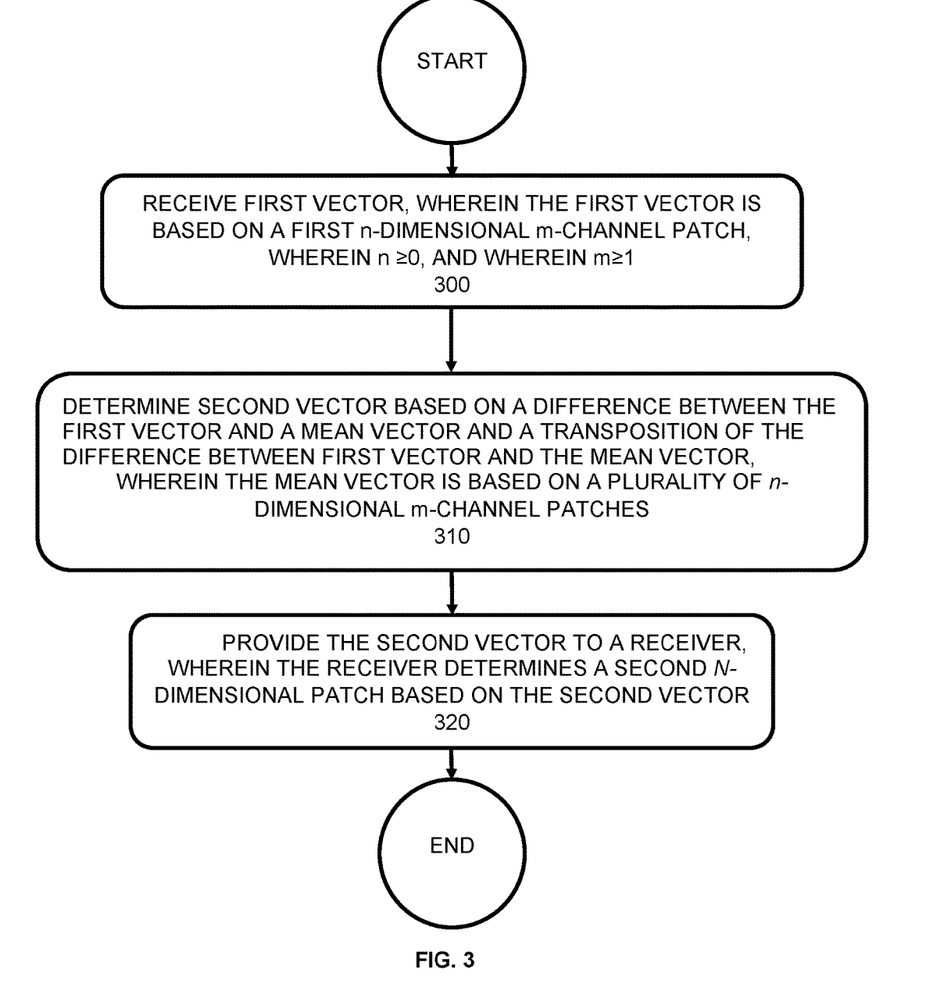
FIG. 3 presents a flow diagram of an example process for compression.

FIG. 3 is a flow diagram of an example process for compressing an n-dimensional m-channel patch. For convenience, the process shown in FIG. 3 will be described as being performed by a system of one or more computers located in one or more locations. During operation, the system performs the following steps. First, the system receives a first vector (operation 300), wherein the first vector is based on a first n-dimensional m-channel patch, wherein $n \geq 0$ and wherein $m \geq 1$. Note that the first vector is equivalent to the first n-dimensional m-channel patch except that the former is a flattened representation of the latter.

Next, the system determines a second vector based on a difference between the first vector and a mean vector and a transposition of the difference between first vector and the mean vector, wherein the mean vector is based on a plurality of n-dimensional m-channel patches. This mean vector can be based on the results of unsupervised learning (clustering) on a training set based on a plurality of (flattened) n-dimensional m-channel patches.

Each patch in this plurality of n-dimensional m-channel patches can be flattened into a vector to facilitate the aforementioned unsupervised learning (clustering). This clustering then produces several parameters, including the mean vector, a covariance matric, and a probability—one such triple of parameters for each cluster. As mentioned above, many techniques can be used to determine an appropriate number of clusters.

Subsequently, the system provides the second vector to a receiver, wherein the receiver determines a second n-dimensional m-channel based on the second vector. This second n-dimensional m-channel can be based on the second vector as well as a model. This model can be the aforementioned cluster model (or its mathematical equivalent) or another model trained on a plurality of pairs of elements, where the first element comprises a second vector and a second element comprises a corresponding vectors equivalent to a second n-dimensional m-channel patch. These pairs can be viewed as training examples to facilitate building a decompression model using a supervised machine learning method.

The system can provide the receiver this second vector through a communication system, which can be any known or later developed device or system for connecting a computer to a receiver, including a direct cable connection, a connection over a wide area network or a local area network, a connection over an intranet, a connection over the Internet, or a connection over any other distributed processing network or system. Further, the communication links can be wired or wireless links to a network. The network can be a local area network, a wide area network, an intranet, the Internet, or any other distributed processing and storage network.

The preceding description is presented to enable any person skilled in the art to make and use the subject matter, and is provided in the context of a particular application and its requirements. Various modifications to the disclosed embodiments will be readily apparent to those skilled in the art, and the general principles defined herein may be applied to other embodiments and applications without departing from the spirit and scope of the subject matter. Thus, the subject matter is not limited to the embodiments shown, but is to be accorded the widest scope consistent with the principles and features disclosed herein.

Embodiments of the subject matter and the functional operations described in this specification can be implemented in digital electronic circuitry, in tangibly embodied computer software or firmware, in computer hardware, including the structures disclosed in this specification and their structural equivalents, or in combinations of one or more of them.

Embodiments of the subject matter described in this specification can be implemented as one or more computer programs, i.e., one or more modules of computer program instructions encoded on a tangible non-transitory program carrier for execution by, or to control the operation of data processing system.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code.

Alternatively, or in addition, the program instructions can be encoded on an artificially generated propagated signal, e.g., a machine-generated electrical, optical, or electromagnetic signal, that is generated to encode information for transmission to a suitable receiver system for execution by a data processing system. The computer storage medium can be a machine-readable storage device, a machine-readable storage substrate, a random or serial access memory device, or a combination of one or more of them.

Computers suitable for the execution of a computer program include, by way of example, can be based on general or special purpose microprocessors or both, or any other kind of central processing unit. Generally, a central processing unit will receive instructions and data from a read only memory or a random-access memory or both. The essential elements of a computer are a central processing unit for performing or executing instructions and one or more memory devices for storing instructions and data.

A computer can also be distributed across multiple sites and interconnected by a communication network, executing one or more computer programs to perform functions by operating on input data and generating output.

A computer can also be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Generally, a computer will also include, or be operatively coupled to receive data from or transfer data to, or both, one or more mass storage devices for storing data, e.g., magnetic, magneto optical disks, or optical disks. However, a computer need not have such devices.

The term "data processing system" encompasses all apparatus, devices, and machines for processing data, including by way of example a programmable processor, a computer, or multiple processors or computers.

For a system of one or more computers to be configured to perform particular operations or actions means that the system has installed on it in software, firmware, hardware, or a combination of them that in operation cause the system to perform the operations or actions. For one or more computer programs to be configured to perform particular operations or actions means that the one or more programs include instructions that, when executed by data processing system, cause the system to perform the operations or actions.

The processor and the memory can be supplemented by, or incorporated in, special purpose logic circuitry. More generally, the processes and logic flows can also be performed by and be implemented as special purpose logic circuitry, e.g., an FPGA (field programmable gate array) or an ASIC (application specific integrated circuit), a dedicated or shared processor that executes a particular software module or a piece of code at a particular time, and/or other programmable-logic devices now known or later developed. When the hardware modules or system are activated, they perform the methods and processes included within them.

The system can also include, in addition to hardware, code that creates an execution environment for the computer program in question, e.g., code that constitutes processor firmware, a protocol stack, a database management system, an operating system, or a combination of one or more of them.

The computer-readable storage medium includes, but is not limited to, volatile memory, non-volatile memory, magnetic and optical storage devices such as disk drives, magnetic tape, CDs (compact discs), DVDs (digital versatile discs or digital video discs), computer instruction signals embodied in a transmission medium (with or without a carrier wave upon which the signals are modulated), and other media capable of storing computer-readable media now known or later developed. For example, the transmission medium may include a communications network, such as a LAN, a WAN, or the Internet.

Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks.

The methods and processes described in the detailed description section can be embodied as code and/or data, which can be stored in a computer-readable storage medium as described above. When a computer system reads and executes the code and/or data stored on the computer-readable storage medium 120, the computer system performs the methods and processes embodied as data structures and code and stored within the computer-readable storage medium.

The components of the system can be interconnected by any form or medium of digital data communication, e.g., a communication network. Examples of communication networks include a local area network ("LAN") and a wide area network ("WAN"), e.g., the Internet.

While this specification contains many specific implementation details, these should not be construed as limitations on the scope of any subject matter or of what may be claimed, but rather as descriptions of features that may be specific to particular embodiments of particular subject matters. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

Moreover, the separation of various system modules and components in the embodiments described above should not be understood as requiring such separation in all embodiments, and it should be understood that the described program components and systems can generally be integrated together in a single software product or packaged into multiple software products.

The foregoing descriptions of embodiments of the subject matter have been presented only for purposes of illustration and description. They are not intended to be exhaustive or to limit the subject matter to the forms disclosed. Accordingly, many modifications and variations will be apparent to practitioners skilled in the art. Additionally, the above disclosure is not intended to limit the subject matter. The scope of the subject matter is defined by the appended claims.

What is claimed is:

1. A computer-implemented method for facilitating compression, comprising:
   receiving a first vector,
      wherein the first vector is based on an n-dimensional m-channel patch,
      wherein $n \geq 0$, and
      wherein $m \geq 1$;
   determining a second vector based on a difference between the first vector and a mean vector and a transposition of the difference between first vector and the mean vector,
      wherein the mean vector is based on a plurality of n-dimensional m-channel patches; and
   providing the second vector to a receiver,
      wherein the receiver determines a second n-dimensional m-channel patch based on the second vector.

2. The method of claim 1,
wherein determining a second vector is additionally based on a covariance matrix, and
wherein the covariance matrix is based on the plurality of n-dimensional m-channel patches.

3. The method of claim 2,
wherein determining a second vector is additionally based on a probability, and
wherein the probability is based on the plurality of n-dimensional m-channel patches.

4. The method of claim 2,
wherein the covariance matrix is diagonal.

5. The method of claim 1,
wherein the m-channels are based on m clusters.

6. One or more non-transitory computer-readable storage media storing instructions that when executed by one or more computers cause the one or more computers to perform operations for facilitating compression, comprising:
receiving a first vector,
wherein the first vector is based on an n-dimensional m-channel patch,
wherein $n \geq 0$, and
wherein $m \geq 1$;
determining a second vector based on a difference between the first vector and a mean vector and a transposition of the difference between first vector and the mean vector,
wherein the mean vector is based on a plurality of n-dimensional m-channel patches; and
providing the second vector to a receiver,
wherein the receiver determines a second n-dimensional m-channel patch based on the second vector.

7. The one or more non-transitory computer-readable storage media of claim 6,
wherein determining a second vector is additionally based on a covariance matrix, and
wherein the covariance matrix is based on the plurality of n-dimensional m-channel patches.

8. The one or more non-transitory computer-readable storage media of claim 6,
wherein determining a second vector is additionally based on a probability, and
wherein the probability is based on the plurality of n-dimensional m-channel patches.

9. The one or more non-transitory computer-readable storage media of claim 7,
wherein the covariance matrix is diagonal.

10. The one or more non-transitory computer-readable storage media of claim 6,
wherein the m-channels are based on m clusters.

11. A system comprising one or more computers and one or more storage devices storing instructions that when executed by the one or more computers cause the one or more computers to perform operations for facilitating compression, comprising:
receiving a first vector,
wherein the first vector is based on an n-dimensional m-channel patch,
wherein $n \geq 0$, and
wherein $m \geq 1$;
determining a second vector based on a difference between the first vector and a mean vector and a transposition of the difference between first vector and the mean vector,
wherein the mean vector is based on a plurality of n-dimensional m-channel patches; and
providing the second vector to a receiver,
wherein the receiver determines a second n-dimensional m-channel patch based on the second vector.

12. The system of claim 11,
wherein determining a second vector is additionally based on a covariance matrix, and
wherein the covariance matrix is based on the plurality of n-dimensional m-channel patches.

13. The system of claim 11,
wherein determining a second vector is additionally based on a probability, and
wherein the probability is based on the plurality of n-dimensional m-channel patches.

14. The system of claim 12,
wherein the covariance matrix is diagonal.

15. The system of claim 11,
wherein the m-channels are based on m clusters.

\* \* \* \* \*